United States Patent
Ranta

(10) Patent No.: US 12,113,057 B2
(45) Date of Patent: *Oct. 8, 2024

(54) SYMMETRIC FET FOR RF NONLINEARITY IMPROVEMENT

(71) Applicant: pSemi Corporation, San Diego, CA (US)

(72) Inventor: Tero Tapio Ranta, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 519 days.

This patent is subject to a terminal disclaimer.

(21) Appl. No.: 17/225,625

(22) Filed: Apr. 8, 2021

(65) Prior Publication Data

US 2021/0335773 A1  Oct. 28, 2021

Related U.S. Application Data

(63) Continuation of application No. 15/953,361, filed on Apr. 13, 2018, now Pat. No. 10,978,436.

(51) Int. Cl.
*H01L 27/02* (2006.01)
*H01L 21/768* (2006.01)
(Continued)

(52) U.S. Cl.
CPC .... *H01L 27/0207* (2013.01); *H01L 21/76895* (2013.01); *H01L 21/84* (2013.01);
(Continued)

(58) Field of Classification Search
CPC ............. H01L 27/0207; H01L 27/0629; H01L 27/1203; H01L 27/088; H01L 21/76895;
(Continued)

(56) References Cited

U.S. PATENT DOCUMENTS

| 7,910,993 | B2 | 3/2011 | Brindle et al. |
| 8,432,016 | B1* | 4/2013 | Kerr ................ H01L 21/823481 257/206 |

(Continued)

OTHER PUBLICATIONS

Wilbert, David S., Office Action received from the USPTO dated Mar. 22, 2019 for U.S. Appl. No. 15/953,361, 6 pgs.

(Continued)

*Primary Examiner* — Dale E Page
*Assistant Examiner* — Quovaunda Jefferson
(74) *Attorney, Agent, or Firm* — JAQUEZ LAND GREENHAUS & McFARLAND LLP; Alessandro Steinfl, Esq.

(57) ABSTRACT

A physical layout of a symmetric FET is described which provides symmetry in voltages coupled to structures of the FET so to reduce OFF state asymmetry in capacitances generated by the structures when the FET is used as a switch. According to one aspect, the symmetric FET is divided into two halves that are electrically coupled in parallel. Gate structures of the two half FETs are arranged in the middle region of the layout, each gate structure having gate fingers that project towards opposite directions. Interdigitated source and drain structures run along the gate fingers and include crossover structures that cross source and drain structures in the middle region of the layout. The gate structures share a body contact region that is arranged in the middle of the layout between the two gate structures.

23 Claims, 18 Drawing Sheets

(51) Int. Cl.
- *H01L 21/84* (2006.01)
- *H01L 23/482* (2006.01)
- *H01L 23/66* (2006.01)
- *H01L 27/06* (2006.01)
- *H01L 27/12* (2006.01)
- *H01L 29/417* (2006.01)

(52) U.S. Cl.
CPC .......... *H01L 23/4824* (2013.01); *H01L 23/66* (2013.01); *H01L 27/0629* (2013.01); *H01L 27/1203* (2013.01); *H01L 29/41758* (2013.01)

(58) Field of Classification Search
CPC ..... H01L 21/84; H01L 21/86; H01L 23/4824; H01L 23/66; H01L 23/642; H01L 29/41758
See application file for complete search history.

(56) References Cited

U.S. PATENT DOCUMENTS

| | | |
|---|---|---|
| 9,461,037 B2 | 10/2016 | Genc |
| 9,842,858 B2 | 12/2017 | Willard |
| 10,410,957 B2 | 9/2019 | Wang et al. |
| 10,978,436 B2 | 4/2021 | Ranta |
| 2009/0095989 A1 | 4/2009 | Kim |
| 2017/0062402 A1 | 3/2017 | Lee |
| 2017/0134016 A1 | 5/2017 | Ranta |
| 2019/0319023 A1 | 10/2019 | Ranta |

OTHER PUBLICATIONS

Jefferson, Quovaunda, Office Action received from the USPTO dated Aug. 30, 2019 for U.S. Appl. No. 15/953,361, 13 pgs.

Jefferson, Quovaunda, Final Office Action received from the USPTO dated Jun. 10, 2020 for U.S. Appl. No. 15/953,361, 10 pgs.

Jefferson, Quovaunda, Notice of Allowance received from the USPTO dated Dec. 15, 2020 for U.S. Appl. No. 15/953,361, 12 pgs.

\* cited by examiner

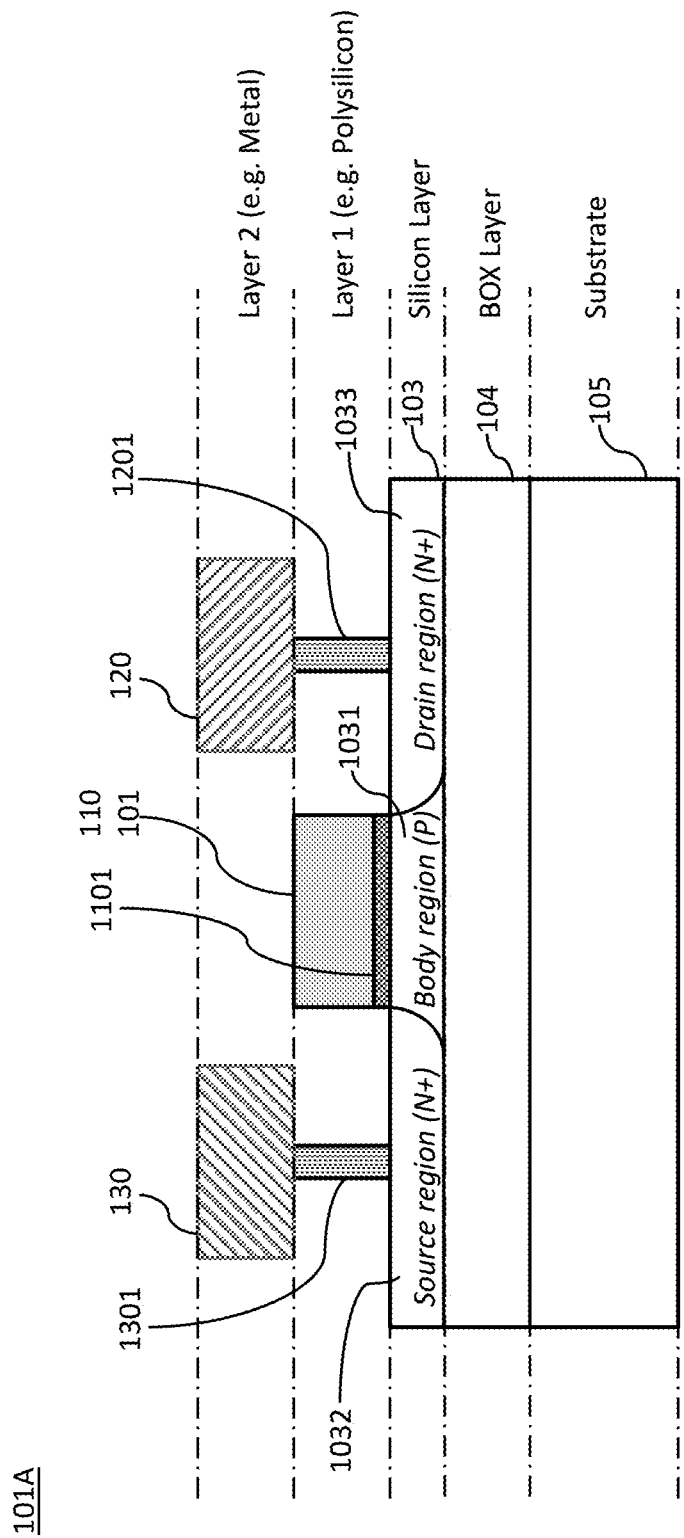
FIG. 1C  *Prior Art*

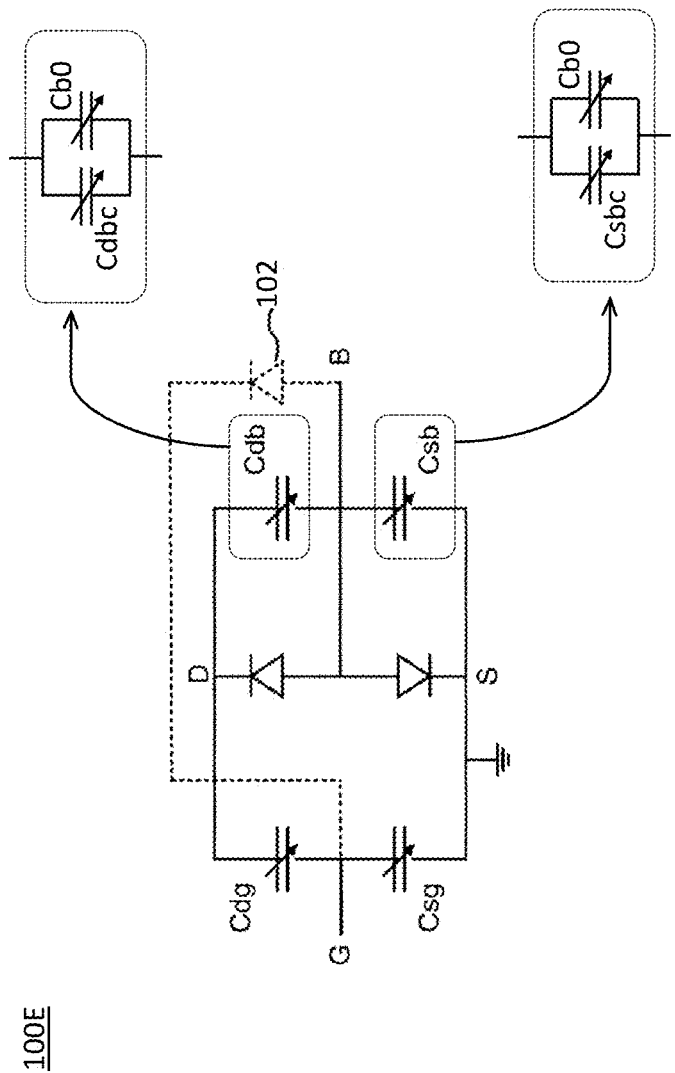
FIG. 1E  *Prior Art*

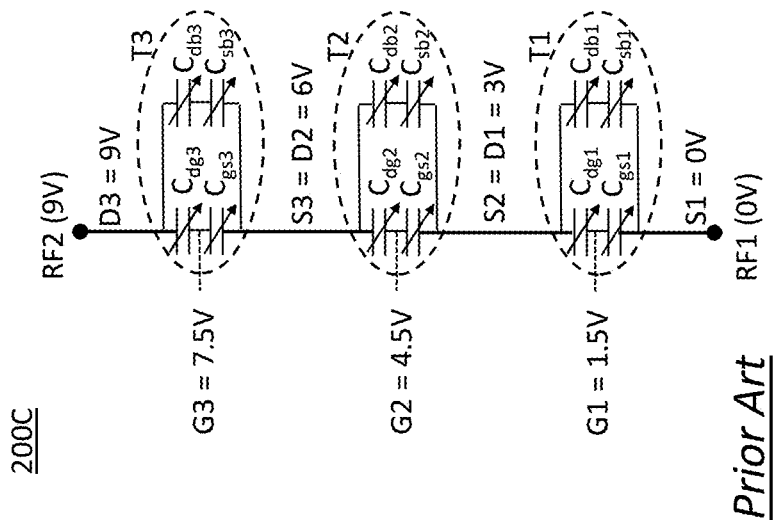
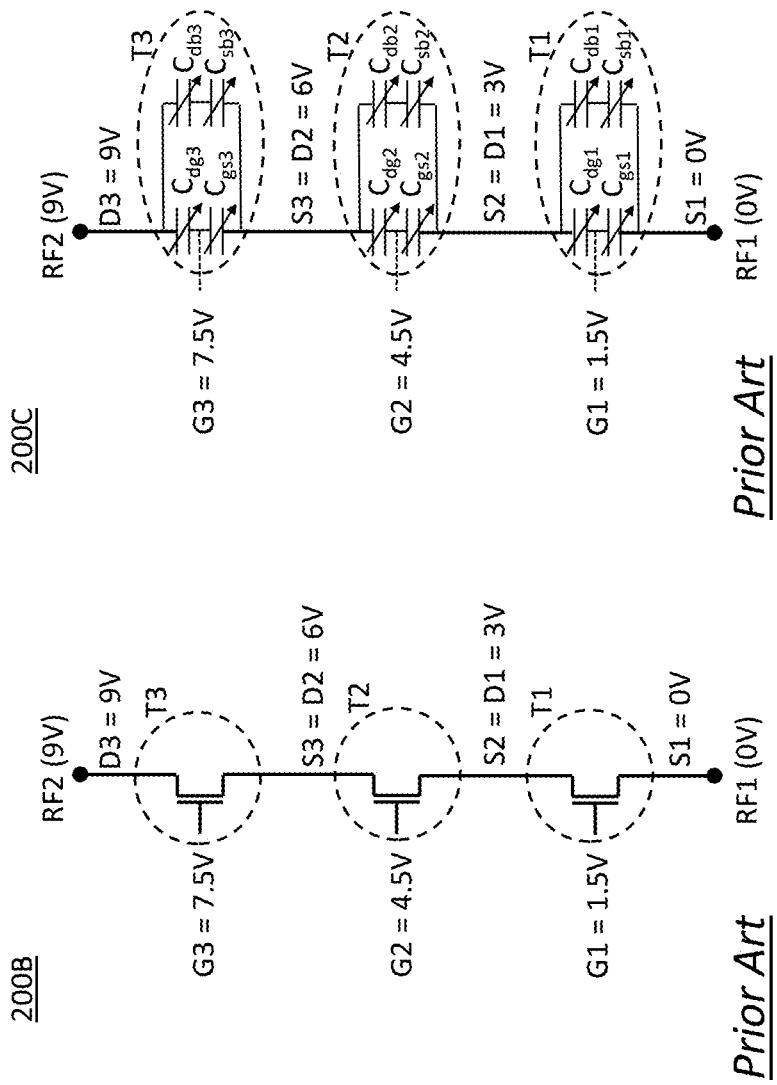
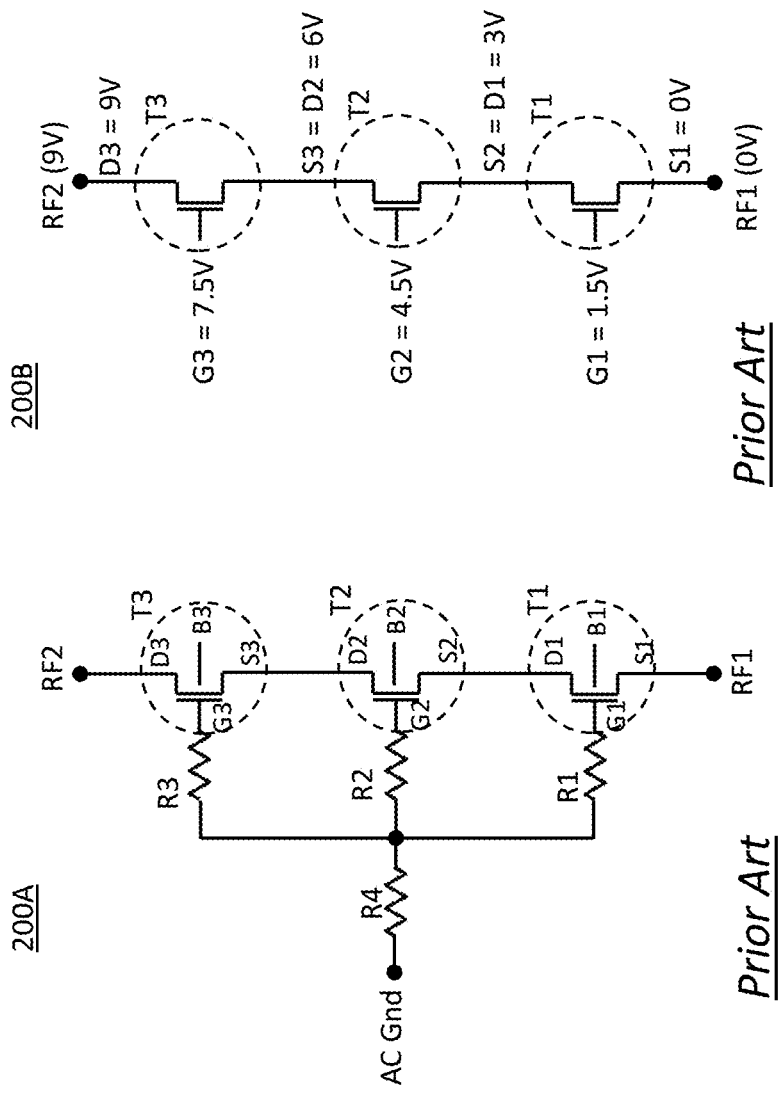
FIG. 2C
FIG. 2B
FIG. 2A
*Prior Art*

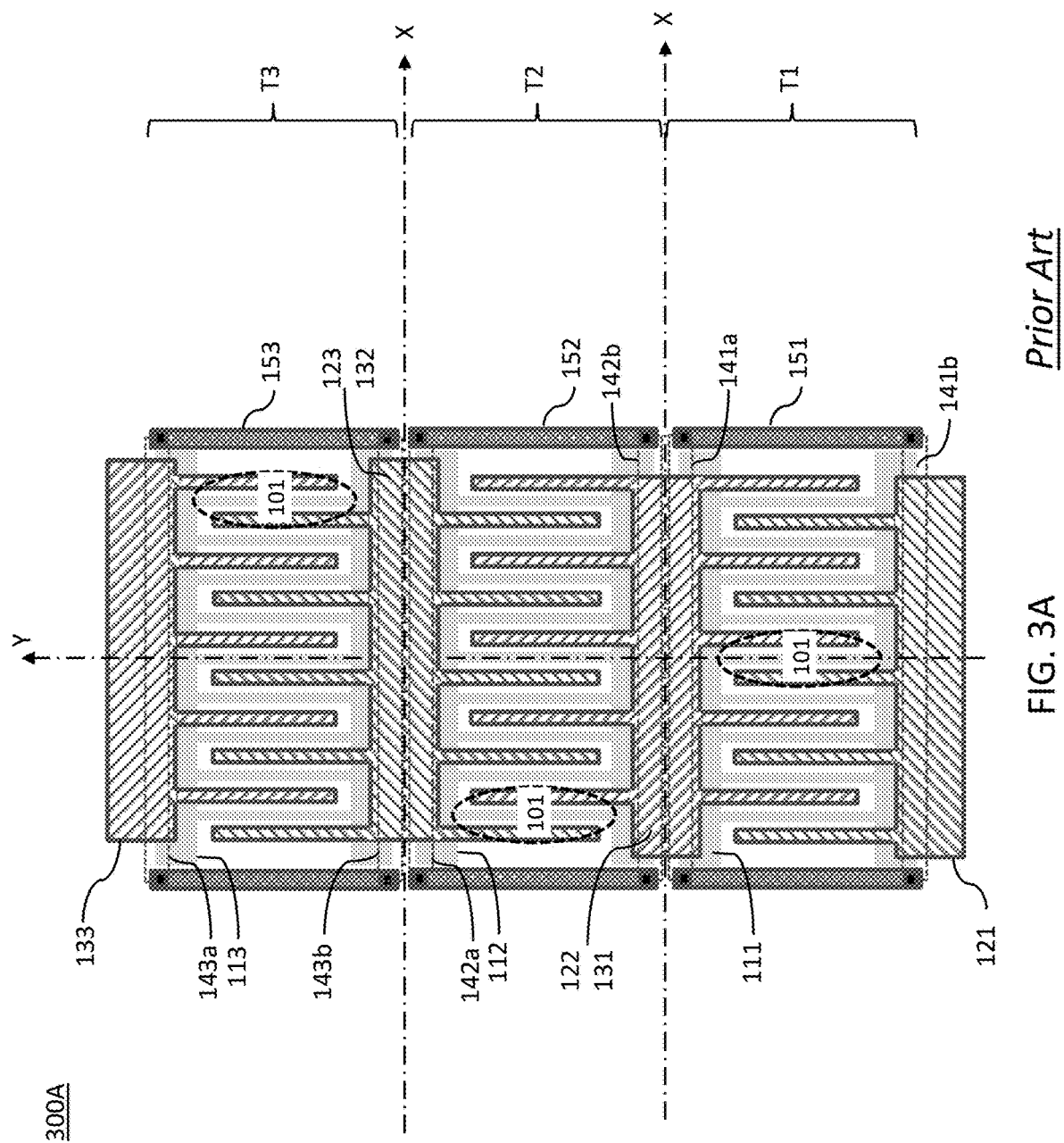
FIG. 3A *Prior Art*

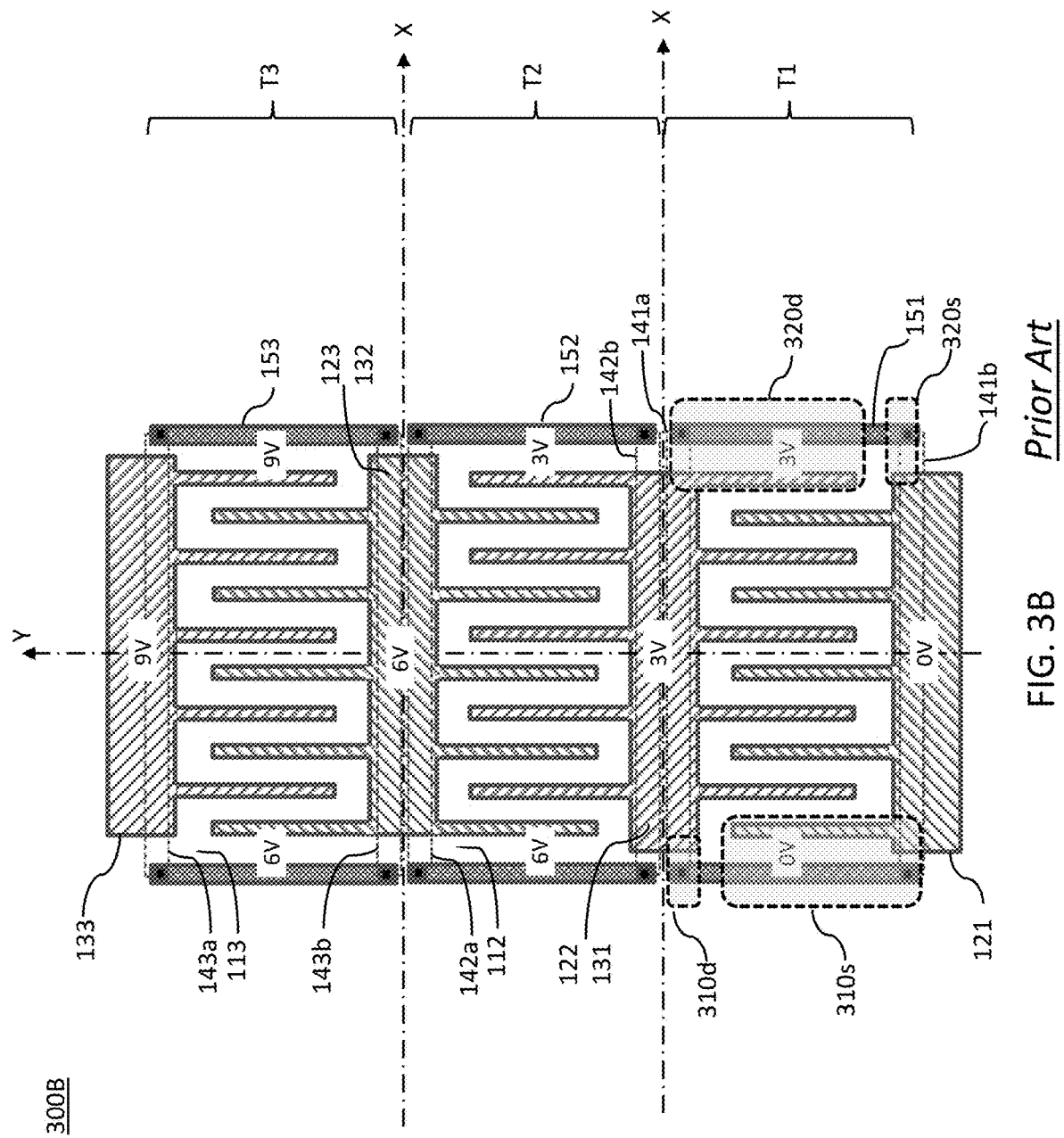
FIG. 3B  *Prior Art*

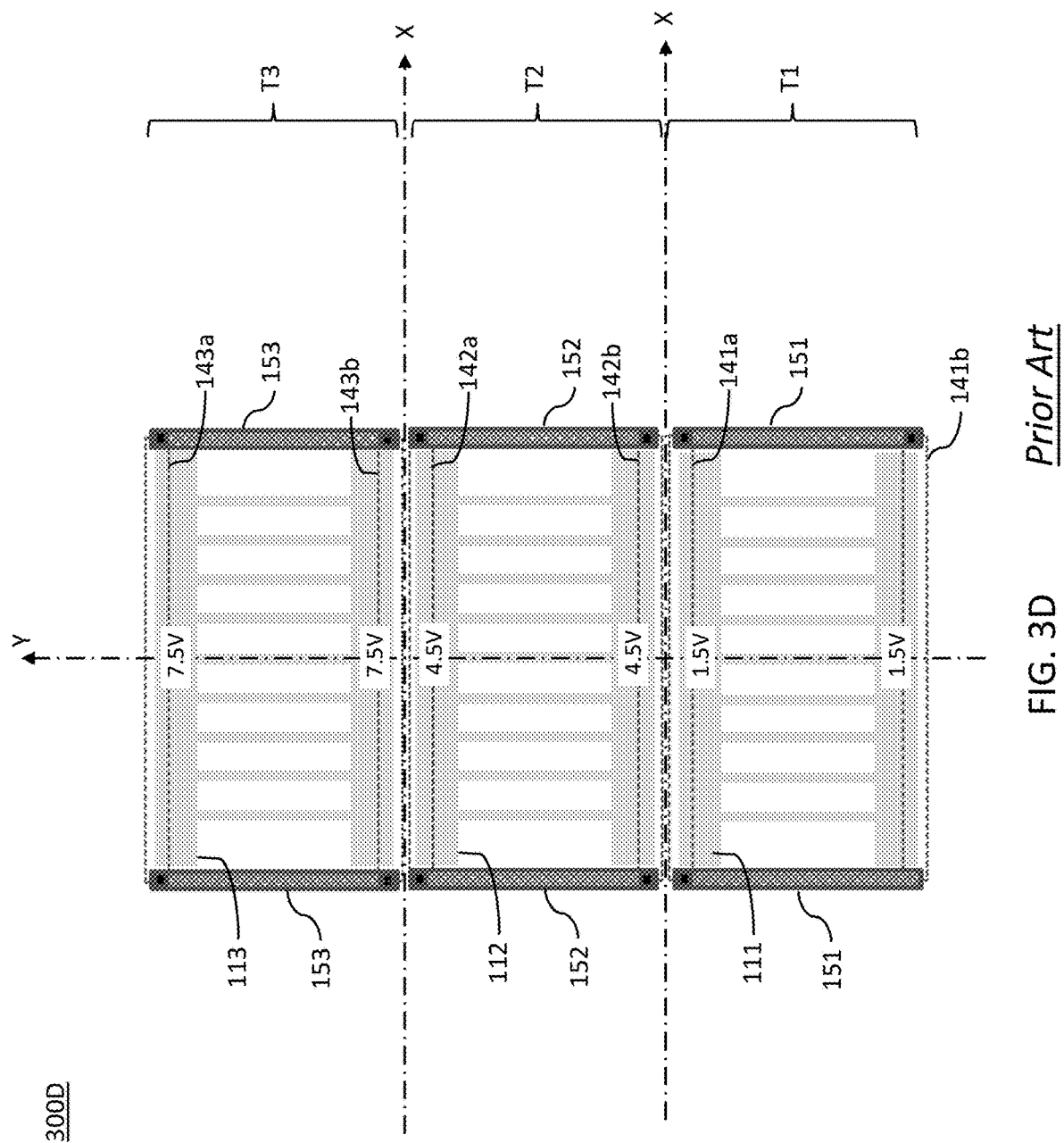
FIG. 3D *Prior Art*

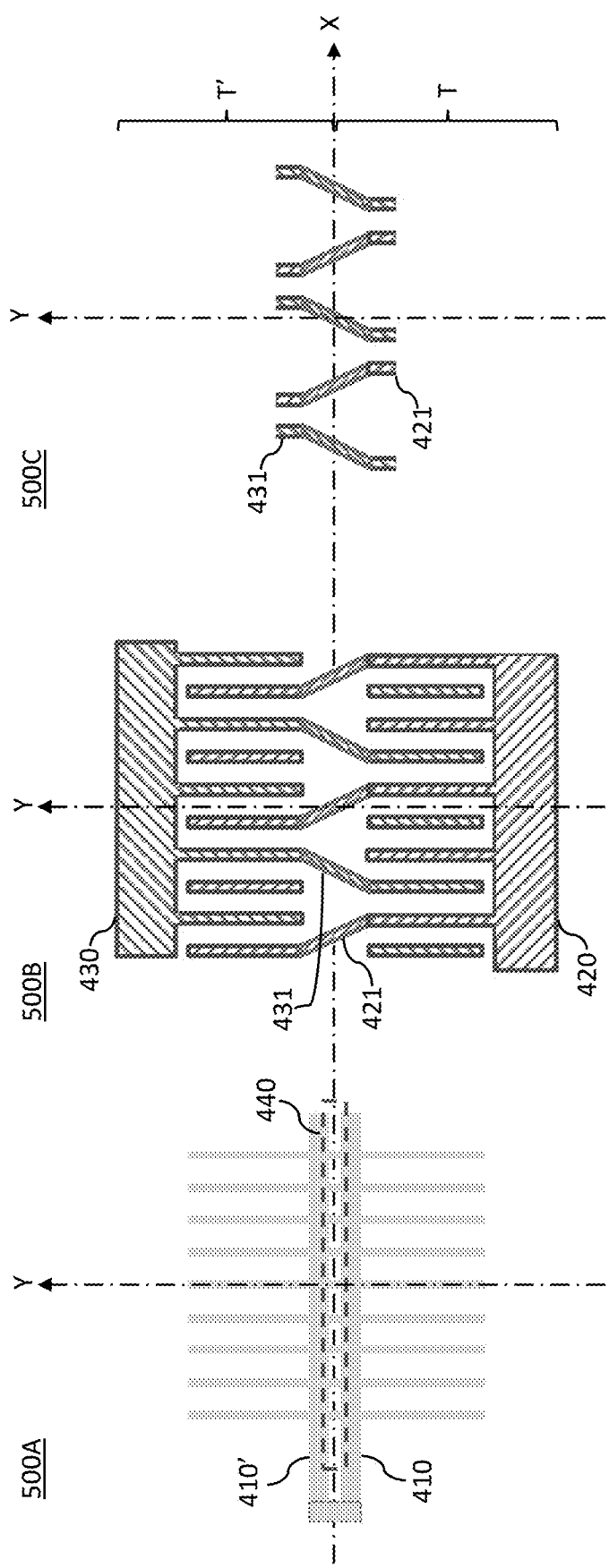

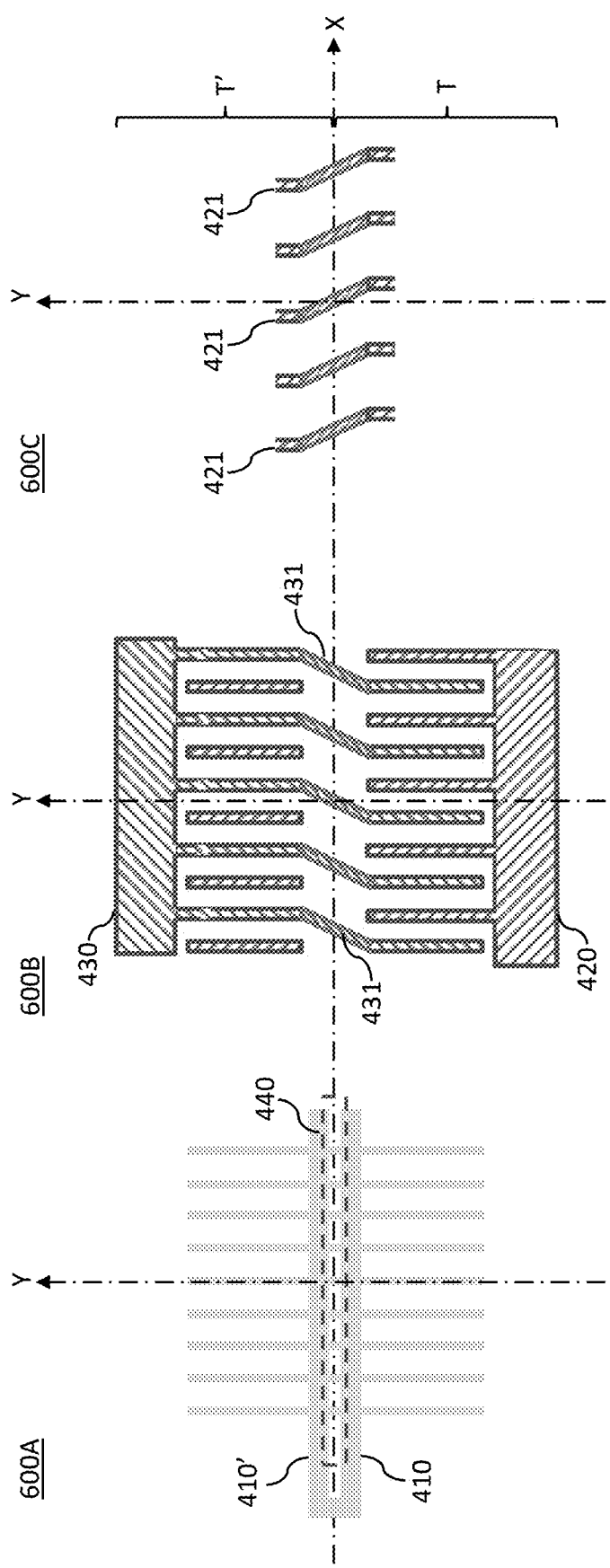

SYMMETRIC FET FOR RF NONLINEARITY IMPROVEMENT

CROSS-REFERENCE TO RELATED APPLICATIONS—CLAIM OF PRIORITY

The present application is a continuation of co-pending U.S. application Ser. No. 15/953,361, filed Apr. 13, 2018, entitled "Symmetric FET for RF Nonlinearity Improvement", to issue on Apr. 13, 2021 as U.S. Pat. No. 10,978,436, which is herein incorporated by reference in its entirety.

The present application may be related to U.S. Pat. No. 9,461,037 B2, entitled "Reduced Generation of Second Harmonics of FETs", issued Oct. 4, 2016, the disclosure of which is incorporated herein by reference in its entirety. The present application may also be related to U.S. Pat. No. 7,910,993 B2, entitled "Method and Apparatus for use in Improving Linearity of MOSFET'S using an Accumulated Charge Sink", issued Mar. 22, 2011, the disclosure of which is incorporated herein by reference in its entirety. The present application may also be related to U.S. Pat. No. 9,842,858, entitled "Butted Body Contact for SOI Transistor", issued Dec. 12, 2017, the disclosure of which is incorporated herein by reference in its entirety. The present application may also be related to U.S. patent application Ser. No. 15/289,768, entitled "Reduced Dissipation Switch FET Gate Biasing", filed on Oct. 10, 2016, now abandoned, the disclosure of which is incorporated herein by reference in its entirety.

TECHNICAL FIELD

The present application generally relates to electronic circuits, and more specifically to field effect transistors having symmetric structures.

BACKGROUND

A field effect transistor (FET) employs a gate-modulated conductive channel between a source region and a drain region. A person skilled in the art would know of various types of FETs, including insulated gate FETs (IGFETs), of which the most common type are metal-oxide-semiconductor FETs (MOSFETs). MOSFETs having n-type or p-type channel conductivity are referred to as an "NMOSFET" or "PMOSFET", respectively.

FIG. 1A is a schematic diagram of a conventional prior art FET 100A, shown with an optional body diode (102). Shown are the source S, drain D, and gate G. Also shown is body connection B to the body or substrate on which the FET is fabricated. As is well known in the art, when a voltage is applied between the gate G and source S terminals of a FET, a generated electric field penetrates through a gate oxide layer to the transistor body B. As one example, for an enhancement mode MOSFET device, a positive bias voltage applied to the gate G creates a conductive channel in the channel region of the MOSFET body through which current passes between the source S and drain D. As another example, for a depletion mode MOSFET device, a conductive channel is present with a zero bias voltage applied to the gate G; varying the voltage applied to the gate G modulates the conductivity of the channel and thereby controls the current flow between the source S and drain D. As it is well known to a person skilled in the art, another common use of a FET is as a simple switch having an "ON" state and an "OFF" state, where in the ON state, a signal passes through the FET between the drain D and source S, and in the OFF state, the signal is blocked (isolated) from passing between the drain D and source S.

As described in the above referenced U.S. Pat. No. 7,910,993 B2, the disclosure of which is incorporated herein by reference in its entirety, when used in certain circuit implementations, conventional MOSFETs may operate under an "accumulated charge" regime and thereby exhibit undesirable non-linear characteristics that adversely impact circuit performance. For example, the accumulated charge can adversely affect the linearity of OFF state silicon-on-insulator (SOI) and silicon-on-sapphire (SOS) MOSFETs, and more specifically, accumulated charge can adversely affect the linearity of capacitances that contribute to the drain-to-source capacitance (Cds) of a MOSFET. In other words, the capacitance in the OFF state, referred to as $C_{OFF}$, where $C_{OFF}$ is equal to drain-to-source capacitance Cds in the OFF state, may vary as a function of a voltage across the drain and source terminals of the MOSFET. Such variation of the OFF state capacitance $C_{OFF}$ can in turn adversely affect harmonic distortion, intermodulation distortion, and other performance characteristics of circuits using such MOSFET, such as, for example, RF switch circuits using stacked MOSFETs. As described in U.S. Pat. No. 7,910,993 B2 referenced above, one way of controlling or removing accumulated charge in such MOSFET is by coupling the body B to the gate G of the MOSFET through a diode (102), as shown in FIG. 1.

However, while this solution significantly reduces harmonic distortion and intermodulation distortion in MOSFETs and circuits using such MOSFETs, such as, for example, RF switch circuits using stacked MOSFETs, adding the diode (102) to the MOSFETs may not (completely) eliminate harmonic distortion. As discussed in the above referenced U.S. Pat. No. 9,461,037 B2, whose disclosure is incorporated herein by reference in its entirety, such residual harmonic distortion may be attributed to asymmetry between a drain-to-body capacitance Cdb, and a source-to-body capacitance Csb, of the MOSFET in the OFF state. As further described in such patent, FET devices with an odd number of gate fingers have lower capacitance asymmetry for Csb and Cdb, and accordingly better harmonic characteristics. In other words, it is suggested that symmetry in structures of the MOSFET can reduce capacitance asymmetry for Csb and Cdb, and therefore reduce second order harmonic distortion. Proposed solutions by the above referenced U.S. Pat. No. 9,461,037 B2 include provision of structures that form compensating capacitance to reduce the capacitance asymmetry for Csb and Cdb, and/or provision of a compensating voltage source across the drain and source terminals of the MOSFET that can affect the capacitance values for Csb and/or Cdb, and therefore reduce the capacitance asymmetry.

The teachings according to the present disclosure address asymmetry in OFF state capacitances of FETs, which can adversely affect second order harmonic characteristics of the FETs, by first recognizing that such capacitances are non-linear and may be affected by variation in voltages coupled to structures forming the capacitances, and second, forming the FETs with semiconductor structures that can provide symmetry in voltages coupled to the structures that form the capacitances. Such teachings can be effective in reducing second order harmonic distortion in a single FET operating as a switch, as well as in a switch using stacked FETs. Furthermore, the teachings according to the present disclosure can be used in conjunction with the above solutions or separate from such solutions.

SUMMARY

The details of one or more embodiments according to the present disclosure are set forth in the accompanying drawings and the description below. Other features, objects, and advantages of such embodiments will be apparent from the description and drawings, and from the claims.

According to a first aspect of the present disclosure, a symmetric field effect transistor (FET) having a structural geometry defined according to a layout in an (x, y) plane is presented, the symmetric FET comprising: first and second gate structures having respective gate fingers defining respective body regions; and a source structure and a drain structure having respective interdigitated source and drain structures arranged in pairs along respective gate fingers; wherein a sequence, in a direction x of the (x, y) plane, of the interdigitated source and drain structures along the gate fingers of the first gate structure is reversed with respect to a sequence, in the direction x, of the interdigitated source and drain structures along the gate fingers of the second gate structure.

According to a second aspect of the present disclosure, a method for reducing OFF state parasitic capacitance of a field effect transistor (FET) operating as a radio frequency (RF) switch is presented, the method comprising: arranging a gate structure in a medial region of a planar layout of the FET; arranging a source structure and a drain structure in respective opposite edges of the planar layout; projecting gate fingers outwardly from the gate structure towards the opposite edges; projecting interdigitated source and drain structures inwardly from respective source and drain structures towards respective opposite edges and along the gate fingers; crossing pairs of the interdigitated source and drain structures in the medial region where the gate structure is arranged; based on the crossing, reversing a sequence of the interdigitated source and drain structures along the gate fingers, thereby providing a symmetry in RF voltages coupled to structures of the FET in the OFF state; and based on the symmetry in the RF voltages, reducing parasitic capacitance.

According to a third aspect of the present disclosure, a symmetric field effect transistor (FET) is presented, the symmetric field effect transistor comprising: a gate structure arranged in a medial region of a planar layout of the symmetric FET; a source structure and a drain structure arranged in respective opposite edges of the planar layout; gate fingers that project outwardly from the gate structure towards the opposite edges; and interdigitated source and drain structures that project inwardly from respective source and drain structures towards respective opposite edges and along the gate fingers; and source and drain crossing structures arranged in the medial region where the gate structure is arranged, configured to provide crossings of pairs of the interdigitated source and drain structures so to reverse a sequence of the interdigitated source and drain structures along the gate fingers in a top half of the layout with respect to a bottom half of the layout.

DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1C shows a cross-sectional view along line AA' of a gate finger of the FET device in FIG. 1B.

FIG. 1E shows a schematic diagram of the FET shown in FIG. 1D, modeled in terms of internal capacitances and diode structures.

FIG. 2A is a schematic diagram of a prior art RF switch using a stack of FETs.

FIG. 2B shows exemplary RF voltages at nodes of the stack of FETs when the RF switch of FIG. 2A is in the OFF state.

FIG. 2C is an RF equivalent circuit representation of the stack of FETs shown in FIG. 2B.

FIG. 3A shows a top-down layout view of the stack of FETs used in the RF switch of FIG. 2A.

FIG. 3B shows coupling of RF voltages between source, drain and body structures of the FETs depicted in FIG. 3A when the RF switch is in the OFF state.

FIG. 3D shows coupling of RF voltages between gate and body structures of the two FETs depicted in FIG. 3A when the RF switch is in the OFF state.

FIG. 5A shows a top-down layout view of a layer comprising the gate structures of the symmetric FET of FIG. 4A.

FIG. 5B shows a top-down layout view of a layer comprising source structures and drain structures of the symmetric FET of FIG. 4A.

FIG. 5C shows a top-down layout view of a layer comprising alternating source and drain crossover structures of the symmetric FET of FIG. 4A.

FIGS. 6A, 6B and 6C show top-down views similar to FIGS. 5A, 5B and 5C respectively, where the crossover structures exclusively correspond to source structures.

Like reference numbers and designations in the various drawings indicate like elements.

DETAILED DESCRIPTION

Figure 1A:
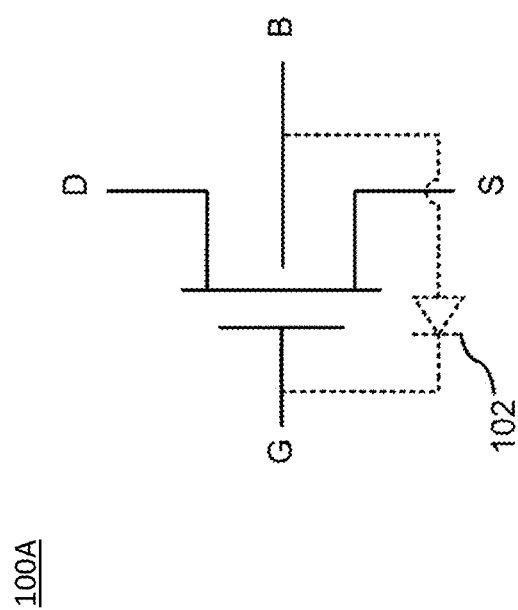
FIG. 1A shows a schematic diagram of a conventional prior art FET with an optional body diode.
Figure 1B:
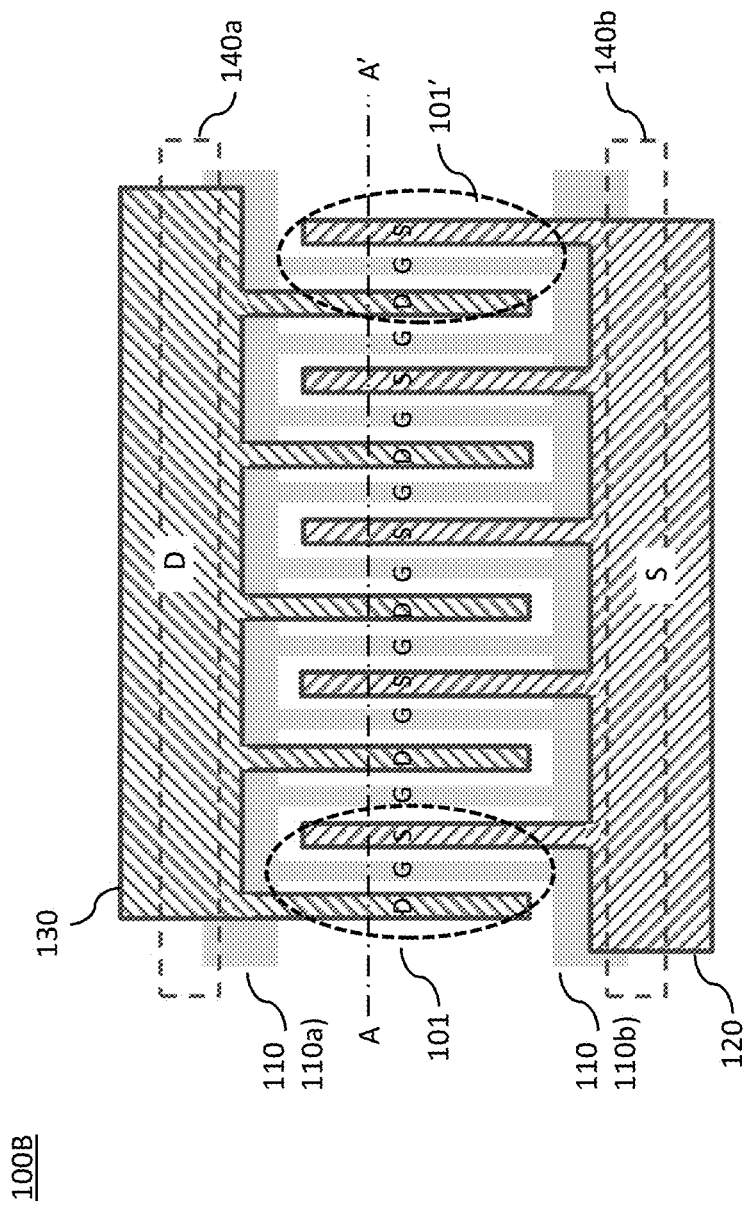
FIG. 1B shows a top-down layout view of a prior art FET comprising a plurality of gate fingers.

FIG. 1B shows a top-down layout view of a prior art FET (100B), such as the FET 100A of FIG. 1A, comprising a plurality of gate fingers (101). As shown in FIG. 1B, each finger (101) may be part of a (polysilicon) gate structure (110) overlaid on a substrate or body (105) by way of standard semiconductor fabrication steps well known to a person skilled in the art. In the particular case of the layout shown in FIG. 1B, the gate structure (110) comprises two structures (110a, 110b) that are joined by the plurality of gate fingers (101). Although other gate structure configurations may be possible, the configuration shown in FIG. 1B is aimed to provide a geometric symmetry to the overall layout structure of the FET with the goal to reduce second order harmonic distortion. As can be seen in FIG. 1B, and well known to a person skilled in the art, drain structure (130) and source structure (120) are interdigitated with the gate fingers (101) so that when the gate structure (110) is biased with an appropriate voltage level, a corresponding conductive channel between the drain structure (130) and source structure (120) through a length of a body region under the gate fingers (101) is created.

It should be noted that FIG. 1B shows several layers of structures that are fabricated on the substrate (105) using well known and standard semiconductor fabrication steps. A cross section of the layout of FIG. 1B across the line AA', in a region of the gate finger (101), is shown in FIG. 1C for a case of a silicon-on-insulator (SOI) fabrication process as known to a person skilled in the art. As can be seen in FIG. 1C, the gate structure (110) may be overlaid on an insulating gate silicon oxide layer (1101) that is placed directly over a silicon layer (103) that includes the source, body and drain regions. As can be seen in FIG. 1C, the silicon layer (103) is overlaid on a buried oxide layer (BOX) (104) that is overlaid on the substrate (105). A person skilled in the art is well aware of the various steps associated with the SOI fabrication process which are beyond the scope of the present disclosure. The gate finger (101) defines a body region (1031) that is flanked by two regions (source region 1032, drain region 1033) having a doping (e.g. N+) that is opposite to the doping of the body region (e.g., P, same as for the substrate), the two regions (1032, 1033) being electrically connected to the drain (130) and the source (120) structures. Electrical connection to the drain and source structures is made through contacts (1301, 1201).

With further reference to FIG. 1B, body contact regions may also be provided in regions (140a) and (140b) of the substrate (105) respectively adjacent to the structures (110a) and (110b). As can be seen in FIG. 1B, the body contact regions (140a, 140b) each extends a full width of the FET (100B) (i.e. across a direction of the line AA'). As used herein, the "full width" of a FET (e.g. FET 100B) refers to the region of the layout along the direction of the line AA' shown in FIG. 1B (or along the X axis shown in FIG. 4A) where contribution to operation of the FET is made. Therefore, the full width includes coordinates along the line AA' that span from the left most finger (101) and associated drain/source, to the right most finger (101') and associated drain/source.

Figure 1D:
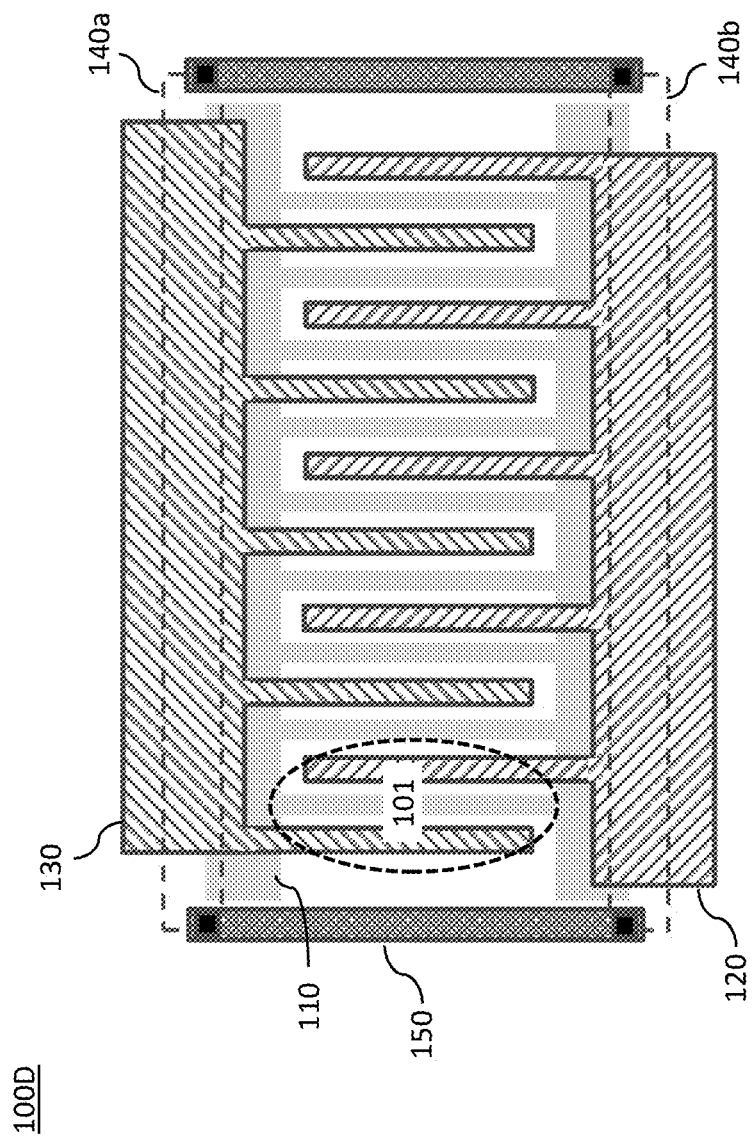
FIG. 1D shows a top-down layout view of a prior art FET comprising a plurality of gate fingers and a connecting structure that electrically shorts two separate body regions of the FET.

As shown in FIG. 1D, the body contact regions (140a, 140b) may be electrically connected through shorting structures (150). A person skilled in the art would know that the shorting structures (150) may be created on same or different layers as used for the gate structure (110) and the drain/source structures (130, 120).

As also discussed in the above referenced patents U.S. Pat. No. 9,461,037 B2 and U.S. Pat. No. 7,910,993 B2, whose disclosures are incorporated herein by reference in their entirety, coupling between the various structures depicted in FIG. 1A and FIG. 1D, creates capacitances that can affect operation of the FET when used as a switch. FIG. 1E shows a schematic diagram of the FET shown in FIG. 1D, modeled in terms of such (internal) capacitances. Shown in FIG. 1E are gate G, drain D, source S, and body B nodes, as well as an optional body-to-gate diode 102. Measurements of the inherent parasitic drain-to-gate capacitance Cdg and source-to-gate capacitance Csg for a variety of device layout geometries show that the two capacitances are similar, and are dependent on the number of gate fingers m, device geometry and size, and device materials. The parasitic drain-to-body capacitance Cdb and source-to-body capacitance Csb are also dependent on the number of gate fingers rn, but differ by the capacitance caused by parasitic drain-to-body coupling, Cdbc, or source-to-body coupling, Csbc, that arises from the particular layout geometry and size of a FET device (in addition, if m is even, Csb will vary even more from Cdb). As shown in FIG. 1E, capacitances Cdb and Csb may be respectively approximated to Cb0+Cdbc and Cb0+Csbc. The exact values of Cdb and Csb for a particular device can be determined empirically or by careful modeling of the device layout. Accordingly, offsetting the asymmetry in capacitances for Cdb and Csb, as provided by the symmetric FET according to the present disclosure described below, will reduce second order harmonic distortion in FETs.

FIG. 2A is a schematic diagram of a prior art RF switch (200A) using a stack of FETs (T1, T2, T3), where each of the FETs may be a prior art FET as described above. A network of resistors (R1, . . . , R4) can be used for biasing of the stack so to control operation of the RF switch according to an OFF and an ON state of the switch. As can be seen in FIG. 2A, the RF switch (200A) comprises two ports, depicted as RF1 and RF2, where in the ON state, a low impedance conduction path is provided through the two ports, and in the OFF mode, a high impedance conduction path isolates the two ports. FIG. 2B shows exemplary RF voltages at nodes of the stack of FETs (T1, T2, T3) when the RF switch (200A) is in the OFF state. Such voltages are based on an RF voltage at port RF2 of 9 volts in amplitude and a grounded port RF1. In the OFF state, all FETs of the stack of FETs (T1, T2, T3) are at their respective OFF states, and can therefore each be modeled according to the schematic represented in FIG. 1E, as shown in FIG. 2C. Assuming a case where the FETs are similar in size, and an ideal case where there is no asymmetry in capacitances, then as shown in FIGS. 2B and 2C, the RF voltage at node RF2 of the switch is capacitively divided by the internal capacitances (Cdg, Cgs, Cdb, Cbs) of the FETs (T1, T2, T3) to provide a substantially equal distribution (division) of the RF voltage at node RF2 across the gate, drain and source nodes of the FETs. Given the model represented in FIG. 2C, a person skilled in the art would realize that any asymmetry in values of capacitances between drain and gate and capacitances between gate and source, would result to an unequal distribution of a voltage across nodes of a transistor, and therefore result in adverse effects on performance of the RF switch, such as, for example, increased second order harmonic distortion. A person skilled in the art would also realize that a height of the stack of FETs (T1, T2, T3), as defined by a number of the FETs, may be a function of a high value of an RF voltage difference between the two nodes (RF1, RF2) of the RF switch. Accordingly, stacks of FETs with different number of FETs (such as 1, 2, 4, . . . , N), can be envisioned, with description of corresponding operation substantially same as one described herewith with reference to a stack having an exemplary number of three FETs.

FIG. 3A shows a prior art top-down layout view of the FETs (T1, T2, T3) of a stack of FETs (e.g. T1, T2, T3) used in an RF switch (e.g. 200A of FIG. 2A). By way of example, structures of the FETs (T1), (T2) and (T3) are discussed here, although same description can apply in discussion related to any three adjacent FET transistors of a stack of FETs, such as the stack of FETs (T1, T2, T3, . . . , Tn). As can be readily understood by a person skilled in the art, the layout shown in FIG. 3A is based on the layout shown in FIG. 1D and described above, where the drain structure (131) of the transistor T1 is shared with (common to) the source structure (122) of the transistor T2. For ease of reference, the layout structure of FIG. 3A is shown referenced to an horizontal axis, X, and a vertical axis, Y, where the plane defined by the axes (X, Y) is parallel to various planes used to form structures of the FETs. In other words, such various planes reside along an orthogonal direction to the plane (X, Y). As can be seen in FIG. 3A, transistor T1 comprises gate (111), source (121) and drain (131) structures, and body regions (141a, 141b) shorted by way of shorting structures (151). Similarly, transistor T2 comprises gate (112), source (122) and drain (132) structures, and body regions (142a, 142b) shorted by way of shorting structures (152), where the source (122) and drain (131) structure are shared structures (e.g. same structures). Finally, transistor T3 comprises gate (113), source (123) and drain (133) structures, and body regions (143a, 143b) shorted by way of shorting structures (153), where the source (123) and drain (132) structure are shared structures (e.g. same structures)

FIG. 3B shows coupling of RF voltages between source, drain and body structures of any two adjacent FETs of the FETs (T1, T2, T3) depicted in FIG. 3A when the RF switch (e.g. 200A of FIG. 2A) is, and therefore each of the FETs (T1, T2, T3) are, in the OFF state. As can be seen in FIG. 3B only related structures (e.g. source, drain, body) are shown, and therefore the gate structures (111, 112, 113) are not shown. For the sake of discussion, RF voltages shown in the figure are based on the RF voltages at the source and drain nodes of the FETs shown in FIG. 2C, although as a person skilled in the art would realize, any asymmetry in capacitance values of the transistors (T1, T2, T3) would affect the RF voltages due to a resulting unequal capacitive voltage division across nodes of the transistors.

With further reference to FIG. 3B, as can be clearly seen, with respect to structures of any of the transistors T1, T2 and T3, many asymmetrical RF voltage values are present. As described above, relative distances (i.e. couplings) of the structures create the various internal capacitances of the transistors. These capacitances can also vary as a function of voltages coupled to such structures. For example, considering the shorting structures (151) of T1, one on the left side is capacitively coupled to 0 volts of the source (121) at the bottom side (bottom portion of highlighted region 310s), remains capacitively coupled to substantially same voltage level through its travel along a structure of the source (121) corresponding to a (first) finger of T1 (medial and top portion of the highlighted region 310s), and finally at its top side (highlighted region 310d), is capacitively coupled to the common source/drain structure (122, 131) that is at 3 volts. On the other hand, the shorting structure (151) on the right side of the layout shown in FIG. 3B, is capacitively coupled to 0 volts of the source (121) at the bottom side (highlighted region 320s), then is capacitively coupled to the 3 volts of the common source/drain structure (122, 131) through its travel along a (last) finger of T1 (bottom and medial portion of the highlighted region 320d), and finally at its top side, remains capacitively coupled to the 3 volts of the common source/drain structure (122, 131) (top portion of the highlighted region 320d).

Figure 3C:
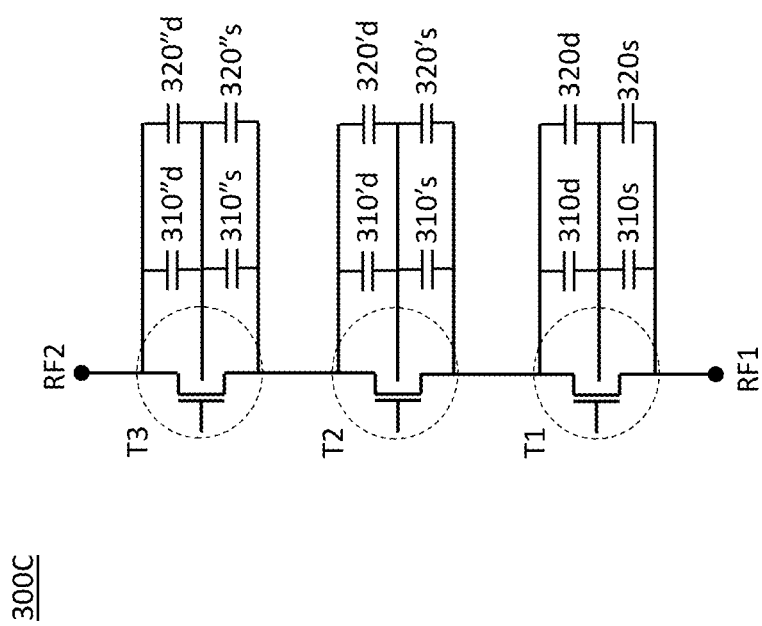
FIG. 3C is an equivalent circuit representation of the stack of FETs shown in FIG. 3B, inclusive of capacitive couplings between source, drain and body structures of the FETs.

Highlighted in FIG. 3B, are (capacitive) couplings (310d, 310s, 320d, 320s) between shorting structures (151) that are electrically connected to the body regions (141a, 141b) of the FET T1, and source (121) and drain (131) structures of the FET T1. As can be seen in FIG. 3B, coupling (310s) is between the shorting structure (151) on the left side of the layout and the source structure (121), coupling (310d) is between the shorting structure (151) on the left side of the layout and the drain structure (131), coupling (320s) is between the shorting structure (151) on the right side of the layout and the source structure (121), and coupling (320d) is between the shorting structure (151) on the right side of the layout and the drain structure (131). A person skilled in the art would realize that such couplings contribute to the overall capacitance values Cdb and Csb discussed above with respect to FIG. 1E. For example, couplings (310d, 320d) can contribute to the overall capacitance Cdb of the FET T1, and couplings (310b, 320b) can contribute to the overall capacitance Csb of the FET T1. Due to the symmetry in the geometry of the structures as laid out in FIG. 3B, the combined size of the couplings (310d, 320d) may be substantially equal to the combined size of the couplings (310b, 320b), but due to different RF voltages coupled to such couplings as described above, asymmetry between values of the overall capacitances Cdb and Csb can be obtained. In turn, as discussed above, such asymmetry can result in unequal distribution of voltages across nodes of the transistor T1, and negatively impact second order harmonic distortion of an RF switch using the transistor T1. A person skilled in the art would understand that same type of asymmetry in voltages coupled to the shorting structures (152, 153) of the transistors (T2, T3) can result similar asymmetry between values of the overall capacitances Cdb and Csb of the transistors (T2, T3) due to similar associated capacitive couplings as shown in FIG. 3C. Contribution of such asymmetry in voltages coupled to various structures of the FETs T1, T2 and T3 can be regarded as parasitic capacitances that combine with the intrinsic capacitances of the FETs, where the intrinsic capacitances provide an equal distribution (division) of the RF voltage amplitude across the two ports (RF1, RF2) of the RF switch in the OFF state. Such parasitic capacitances associated with the couplings (310d, 320d, 310s, 320s) of FET T1, couplings (310'd, 320'd, 310's, 320's) of FET T2, and couplings (310"d, 320"d, 310"s, 320"s) of FET T3, are shown in FIG. 3C.

FIG. 3D shows coupling of RF voltages between gate and body structures of any two adjacent FETs of the FETs (T1, T2, T3) depicted in FIG. 3A when the RF switch (e.g. 200A of FIG. 2A) is, and therefore each of the FETs (T1, T2, T3) are, in the OFF state. As can be seen in FIG. 3D only related structures (e.g. gate, body) are shown, and therefore the source and drain structures (121, 131, 122, 132, 123, 133) are not shown. For the sake of discussion, RF voltages shown in the figure are based on the RF voltages at the gate nodes of the FETs shown in FIG. 2C, although as a person skilled in the art would realize, any asymmetry in capacitance values of the transistors (T1, T2, T3) would affect the RF voltages due to a resulting unequal capacitive voltage division across nodes of the transistors. As can be taken from FIG. 3D, further asymmetry in voltages coupled to the body regions, for example, the body region (141b) of FET T1 is coupled, substantially through its full width, to the 1.5 volts of the gate (111) structure, and the body region (141a) is coupled, substantially through its full width, to the 1.5 volts of the gate (111) structure, but also to some extent, to the 4.5 volts of the gate (112) structure of T2. Similarly, the body regions (142b) and (142a) of FET T2, and (143b) and (143a) of FET T3, are respectively coupled, substantially through their full widths, to different voltages that are also different from the voltages coupled to the body regions (141a, 141b) of FET T1. This means that as these body regions couple to gate structures, the resulting capacitances (e.g. parasitic capacitances) can be different between the FET T1, the FET T2, and the FET T3.

In view of the above discussion, it would be clear to a person skilled in the art that symmetry in structures may not by itself be sufficient for providing symmetry in capacitance values within a same FET and/or across different FETs of a stack of FETs. The teachings according to the present disclosure provide a novel symmetric structure according to which a FET and/or a stack of FETs can be fabricated using conventional fabrication steps known to the skilled person, and which can provide symmetry in voltages coupled to the structure and therefore substantially reduce asymmetry between capacitance values that can, as described above, negatively impact RF performance of a switch using such FET or stack of FETs. A top-down layout view of such symmetric FET structure according to the present disclosure is shown in FIG. 4A.

Figure 4A:
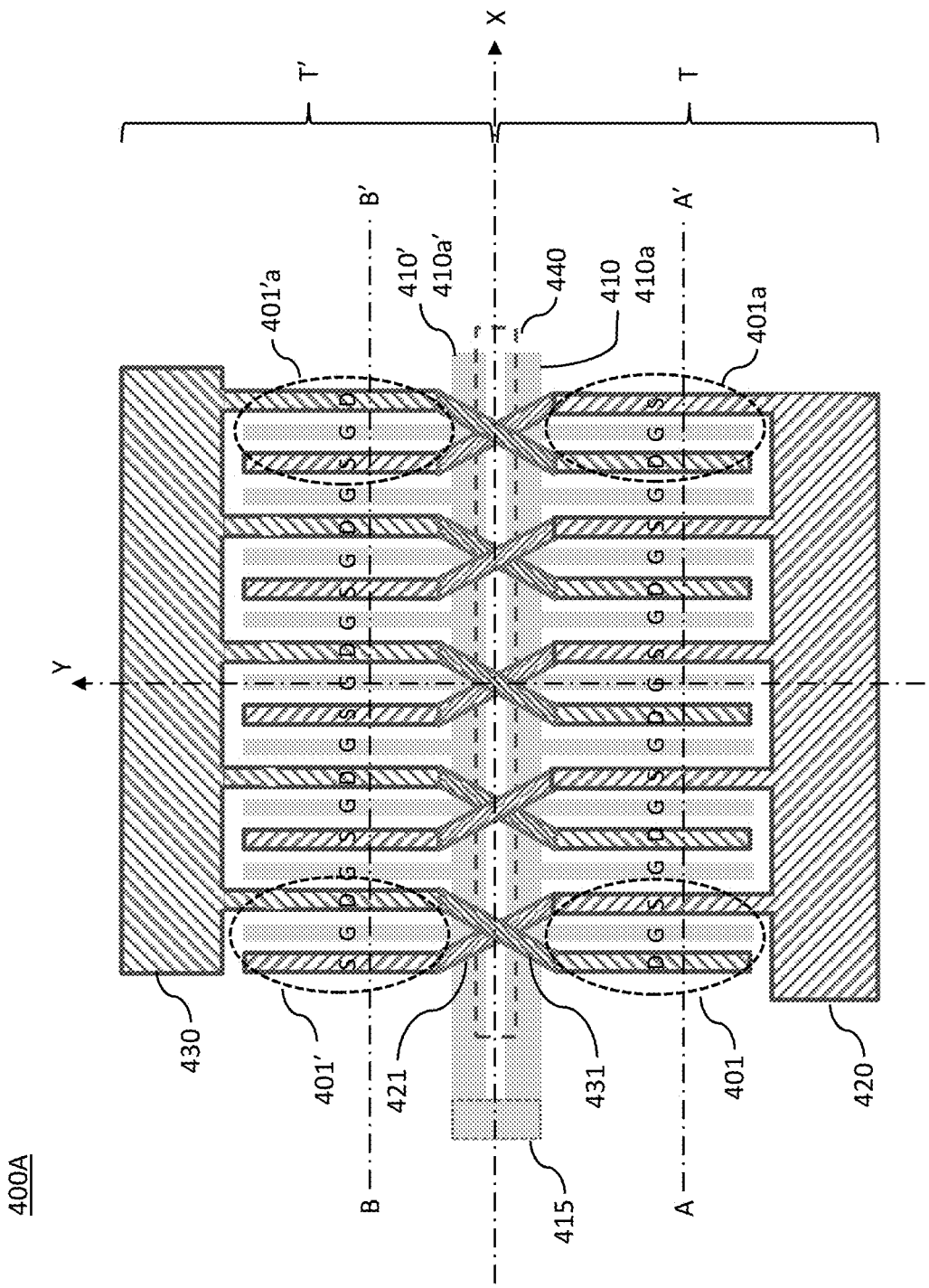
FIG. 4A shows a top-down layout view of a symmetric FET according to an embodiment of the present disclosure, wherein the FET is split in two halves that are connected in parallel, with gate structures in the middle of the layout, each gate structure having gate fingers projecting in opposite directions.

FIG. 4A shows a top-down layout view of a symmetric FET (400A) according to an embodiment of the present disclosure, wherein the FET is split in two halves, T and T', that are electrically connected in parallel, with respective gate structures (410, 410') arranged in the middle of the layout (medial or middle region) so to extend across a full width of the symmetric FET, each gate structure having gate fingers (401, 401') projecting opposite directions towards the source or drain of the FET (400A) arranged on respective top and bottom edges of the FET (400A). As can be seen in FIG. 4A, each of the FETs T and T' operates according to a conventional FET, having gate, drain and source structures that define operation of the FET, as described, for example, with respect to FIG. 1B above. In particular, a cross section of the symmetric FET (400A) along lines AA' in a region of the gate finger (401) shown in FIG. 4A is same as the cross section depicted in FIG. 1C described above, with reference designators changed accordingly (e.g. change 100's to 400's). Also, a cross section of the symmetric FET (400A) along lines BB' in a region of the gate finger (401') shown in FIG. 4A is same as the cross section depicted in FIG. 1C described above but with position of drain and source regions swapped.

With continued reference to FIG. 4A, a bottom half FET, T, includes a gate structure (410) that comprises a structure (410a) arranged in a middle region of the layout and extending across the full width of the symmetric FET (400A). Gate fingers (401) project outwardly along the y-axis from the structure (410a) towards the bottom edge of the layout where the source structure (420) is arranged. As discussed above with reference to FIG. 1B, each of the gate fingers (401) defines a body region that is flanked by two regions having a doping that is opposite to the doping of the body region (e.g. same as for the substrate 405), the two regions being electrically connected to the drain (430) and the source (420) structures. Electrical connection to the drain (430) and source (420) structures being made through contacts (e.g. 1301, 1201 of FIG. 1C) going through a layer comprising the gate (410) structure to make contact to the drain (430) and source (420) structures formed in a layer different from the layer comprising the gate structure (410). Similarly, the top half FET, T', includes structures equivalent to the structures described with respect to the bottom half FET, T, with a difference that gate fingers (401') of gate (410') structure project outwardly along the y-axis from a structure (410a') towards the top edge (in the X, Y plane) of the layout where the drain structure (430) is arranged, and therefore, in a direction that is opposite a direction of the projected gate fingers (401) of the bottom half FET, T. As shown in FIG. 4A, the two gate (410, 410') structures may be electrically connected at least at one end of corresponding structures (410a, 410a') by way of a connecting structure (415). According to one exemplary embodiment of the present disclosure, the connecting structure (415) is of a same material as the gate structures (e.g. polysilicon). According to a further exemplary embodiment of the present disclosure, the two gate (410, 410') structures and the connecting structure (415) are formed as a single integral structure overlaying an insulating gate silicon oxide layer that is formed atop the substrate (405).

With further reference to FIG. 4A, a body contact region (440) is arranged between the two gate (410, 410') structures and extends through the full width of the symmetric FET (400A). In other words, the two gate (410, 410') structures share a same body contact region (440). As described above, the full width of the FET (400A) refers to the region of the layout along the axis X shown in FIG. 4A where contribution to operation of the FET (400A) is made. Therefore, the full width includes coordinates along the X axis that span from the left most fingers (401, 401') and associated drain/source, to the right most fingers (401a, 401'a) and associated drain/source.

With continued reference to FIG. 4A, due to the presence of the structures (410a, 410a') and the body contact region (440), all of which extend across the full width of the symmetric FET (400A), a person skilled in the art would understand that the middle region of the symmetric FET (400A), defined in the (X, Y) plane by the structures (410a, 410a', 440), does not contribute to a gate-modulated conductive channel between source and drain regions that flank body regions underneath the fingers (401, 401'). Rather, a person skilled in the art would understand that gate modulation is provided through regions where gate fingers (401, 401') are present, and through regions where the gate fingers (401a, 401'a) are present.

As can be seen in FIG. 4A, the layout of the symmetric FET (400A) according to the present disclosure is provided by arranging the source (420) structure in the bottom edge of the layout, the drain (430) structure in the top edge of the layout, the gate (410, 410') structures in the middle region of the layout, the body region (440) in the middle region of the layout and in between the two gate (410, 410') structures, the gate fingers (401, 401a) of the bottom half FET, T, projecting from the middle region in the direction of the source (420) structure arranged at the bottom edge of the layout, the gate fingers (401', 401'a) of the top half FET, T', projecting from the middle region in the direction of the drain (430) structure arranged at the top edge of the layout. Also, the source (420) and drain (430) structures include projections towards respective opposite edges of the layout to create interdigitated source and drain structures along the gate fingers (401, 401', 401a, 401'a).

Figure 4B:
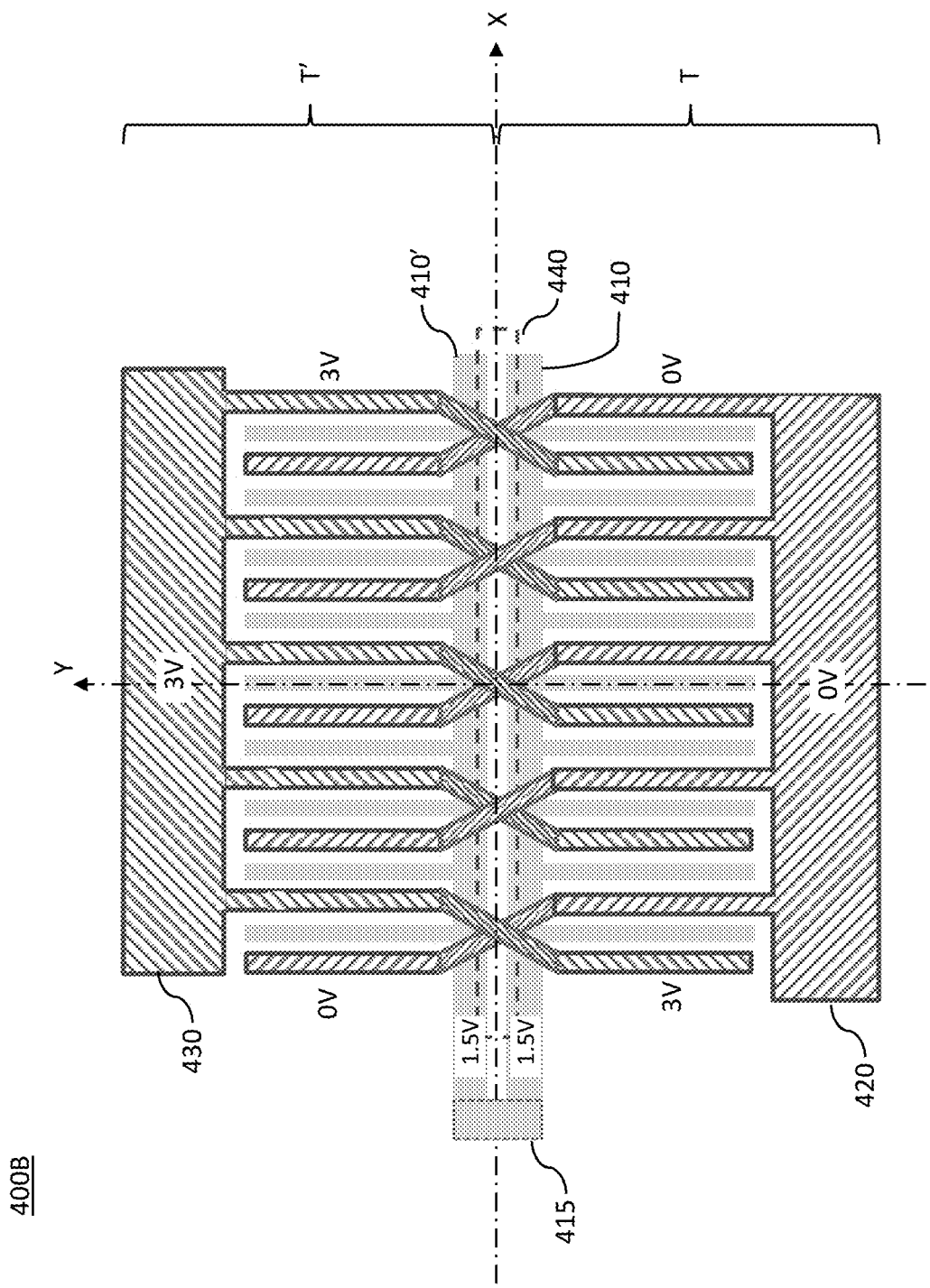
FIG. 4B shows exemplary RF voltages in the OFF state of the symmetric FET of FIG. 4A.

With continued reference to FIG. 4A, in order to provide symmetry of voltages, the interdigitated source and drain structures cross at the middle region of the layout defined by (410a, 410a', 440). This results in the left most fingers (401) and (401') of the layout to be flanked on their respective left sides by different drain or source structures. Same applies for the right most fingers (401a) and (401'a). Crossing of the source (420) and drain (430) structures at the middle region of the layout is provided by respective source crossing structures (421) and drain crossing structures (431). Such crossing structures can be arranged partially or fully on different metal layers, examples of which are described below with respect to FIGS. 5A-5C and FIGS. 6A-6C. A person skilled in the art would realize that the symmetric FET (400A) may also be described as one FET with a plurality of gate fingers and corresponding interdigitated drains and sources, where the gate fingers, and therefore corresponding body regions, are interrupted in the middle region of the layout by way of an interruption that extends across the full width of the FET. Furthermore, at the middle region and through the interruption, the interdigitated drains and sources cross in pairs associated to respective gate fingers, so to reverse (i.e. flip, alter) a sequence of the interdigitation between the bottom half FET, T, and the top half FET, T'. The reversing of the sequence in turn provides symmetry of RF voltages coupled to various structures of the FET, as can be seen in FIG. 4B. As can be seen in FIG. 4A, a sequence of the interdigitation of the drains, D, and sources, S, along the gate fingers and in a direction of the axis X, starting from the left most fingers (401) of the bottom half FET, T, and (401') of the top half FET, T', respectively is, (D, S, D, S, D, . . . , S) and (S, D, S, D, S, . . . , D), which corresponds to a reversal (or flipping) of the sequences between the bottom half and the top half FETs. A person skilled in the art would clearly understand that such reversal is based on the reversal, or flipping, of a relative position of a drain and source with respect to a corresponding gate finger, provided by a corresponding source crossing structure (421) and drain crossing structure (431).

FIG. 4B shows exemplary RF voltages in the OFF state of the symmetric FET of FIG. 4A. The symmetric FET can be part of a single RF switch (stack of one), or a FET in a stack of a plurality of FETs used as an RF switch (e.g. FIG. 10 later discussed). As can be seen in FIG. 4B, not only symmetry in structures is provided, but also symmetry in the RF voltages. In addition, since the body region (440) is fully encompassed in one contiguous region placed in between the gate (410, 410') structures (i.e. corresponding structures 410a, 410a'), provision of shorting structures (e.g. 150) as required in the prior art embodiment shown in FIG. 1D is not necessary. This in turn can reduce capacitance (e.g. Cdb, Csb), as well as associated asymmetry discussed above with reference to FIG. 3B. A person skilled in the art will appreciate the symmetry in physical layout as well as RF voltages provided by the symmetric FET according to the present disclosure, where the symmetry of the coupled RF voltage can reduce asymmetry in capacitance values that can affect RF voltage distribution in the OFF state of the FET, and accordingly reduce related second order harmonic distortion of an RF switch using such FET.

FIGS. 5A, 5B and 5C show top-down layout views, referenced with respect to the (X, Y) plane, of different layers of the symmetric FET FIG. 4A according to an exemplary embodiment of the present disclosure. FIG. 5A shows a layer (500A) of the symmetric FET (400A) that includes the gate (410, 410') structures arranged in the middle region of the layout, each of the gate (410, 410') structures having a plurality of gate fingers projecting opposite directions. A person skilled in the art readily understands that such gate structures (410, 410') may be formed on a polysilicon layer, such as Layer 1 shown in FIG. 1C. Also shown in FIG. 5A is the body contact region (440) that is underneath the two gate (410, 410') structures. A person skilled in the art would clearly understand that the body contact region (440) may be formed by way of a region of the substrate (e.g. 105 of FIG. 1C) and one or more connecting contacts (not shown) to provide an electrical coupling to the body contact region (440), as shown, for example, in FIG. 8 later described.

FIG. 5B shows a layer (500B) of the symmetric FET (400A) that includes the source (420) and drain (430) structures. A person skilled in the art readily understands that such source and drain structures (420, 430) may be formed on a metal layer, such as Layer 2 shown in FIG. 1C. Also shown in the layer (500B) are crossing structures (421, 431) that connect the interdigitated sources and drains of the bottom half FET, T, to respective interdigitated sources and drains of the top half FET, T'. As shown in FIG. 5B, the crossing structures alternate, in sequence from left to right, from a source crossing structure (421) to a drain crossing structure (431), and so on. As the drain and source can be at different RF voltages (e.g. 3 volts and 0 volts per FIG. 4B) during operation of the FET in the OFF state, such alternating crossing structures (421, 431) can balance an effective RF voltage coupled to the body contact region (440) to be substantially same as the RF voltage coupled through the gates (410, 410') structures (1.5 volts). In turn this can promote symmetry in coupled RF voltages to the various structures of the symmetric FET (400A), with benefits described above. A person skilled in the art would realize that the crossing structures (421, 431) shown in layer (500B) of FIG. 5B only represent half of the total crossing structures (421, 431) of the symmetric FET (400A), the other half being provided in a separate layer (500C) as shown in FIG. 5C. A person skilled in the art would also realize that the alternating crossing structures provided in layer (500B) may start, from the left of the layout, by any of the two crossing structures (421, 431) and not necessarily by the source crossing structure (421) shown in FIG. 5B. The content of the layer (500C) complements the crossing structures provided in the layer (500B).

FIGS. 6A, 6B and 6C show a top-down layout views, referenced with respect to the (X, Y) plane, of different layers of the symmetric FET FIG. 4A according to another exemplary embodiment of the present disclosure. As shown in the figures, the main difference with the embodiment depicted in FIGS. 5A, 5B and 5C described above, is in the arrangement of the crossing structures (421, 431) over the layers (600B, 600C) versus the layers (500B, 500C). As shown in FIG. 6B, the layer (600B) contains exclusively the drain crossing structures (431) and the layer (600C) of FIG. 6C contains exclusively the source crossing structures (421) so to complement the crossing structures included in the layer (600B). Again, a person skilled in the art would realize that any of the two types of crossing structures (421, 431) can be included exclusively in the layer (600B) and the other in the layer (600C), so not to limit the invention to the mere exemplary case depicted in FIGS. 6B and 6C. A person skilled in the art can clearly envision other embodiments based on the exemplary embodiments described with reference to FIGS. 5A-5C and FIG. 6A-6C, where, for example, a combination of alternate crossing structures (421, 431) for a number of consecutive fingers is provided on a first layer, and then, on the same layer, several same type of crossing structures are provided in a row, and so on. A second layer, or several layers, would always complement the crossing structures of the first layer. A person skilled in the art would realize that the crossing structures (421, 431) may not necessarily be contained in two layers, and more than two layers may be used if desired.

Figure 7:
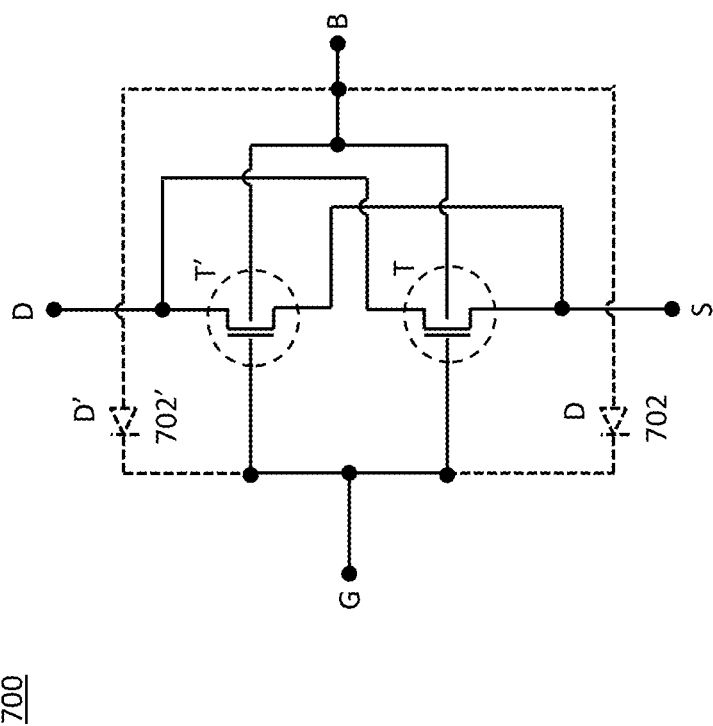
FIG. 7 shows an equivalent schematic diagram of the symmetric FET shown in FIG. 4A with optional body diodes.

FIG. 7 shows an equivalent schematic diagram of the symmetric FET (400A) shown in FIG. 4A with optional body diodes (702, 702'). As can be seen in FIG. 7, the FET (400A) includes two smaller width FETs, T, T', that are electrically connected in parallel, to provide a full size of the FET (400A). Concept of "width" of a FET and "parallel" electrical connection of a FET are well understood by a person skilled in the art. In particular, a person skilled in the art would know that the gate fingers and flanking interdigitated source/drain structures as shown and described above, can be likened to a plurality of parallel FETs whose currents (e.g. drain to source) combine to provide a larger current. In the case of the present invention, two sets of such parallel FETs are further combined in parallel to provide for a larger current (i.e. width) of the symmetric FET (400A). In a case where the diodes (702, 702') are desired, provision of two such diodes, rather than one as per the prior art, can further promote symmetry of structures used in a corresponding FET layout, as shown in FIG. 8.

Figure 8:
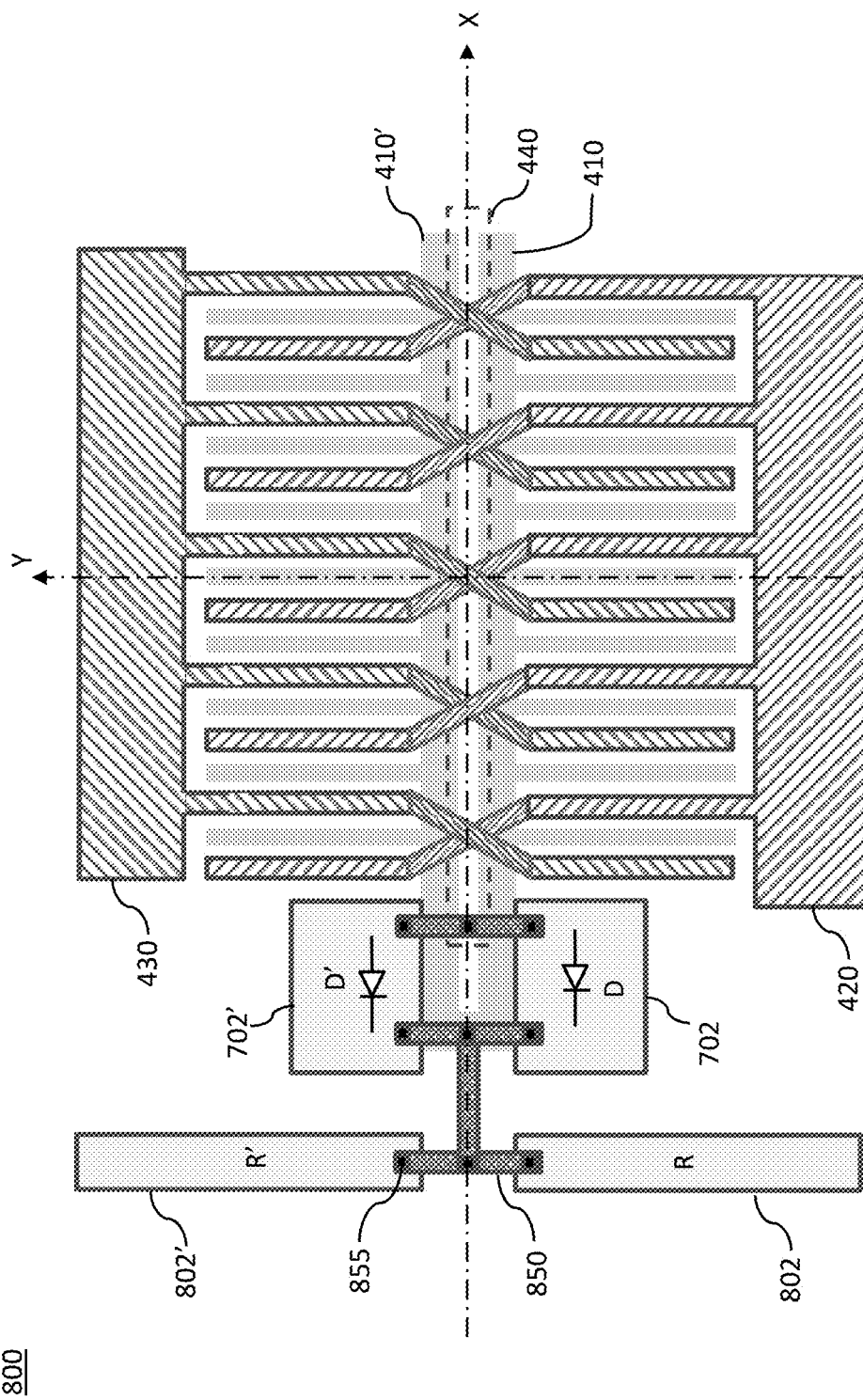
FIG. 8 shows a top-down layout view of a symmetric circuit comprising the symmetric FET shown in FIG. 4A, with symmetric body diodes and symmetric resistors used for biasing the FET when used in a stack operating as an RF switch.
Figure 9:
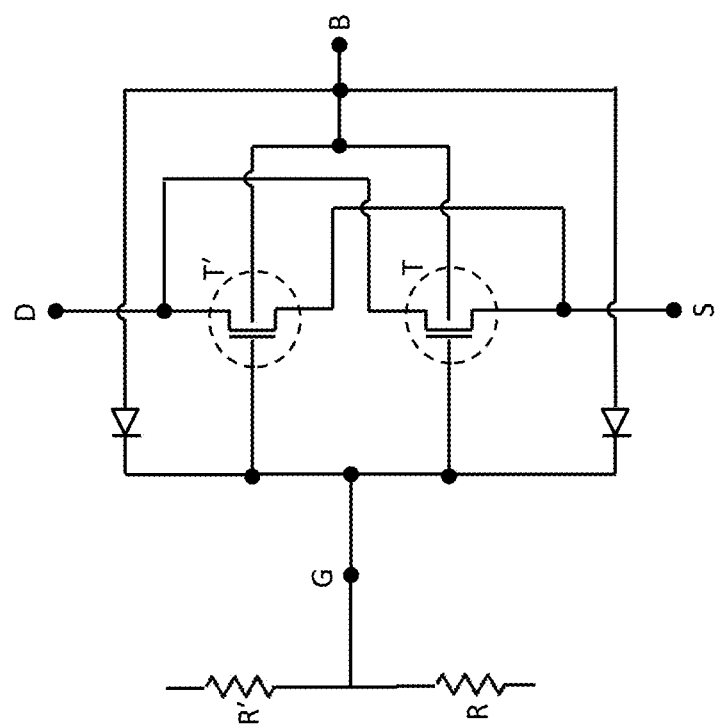
FIG. 9 shows an equivalent schematic diagram of the symmetric circuit shown in FIG. 8.

FIG. 8 shows a top-down layout view of a symmetric circuit (800) comprising the symmetric FET (400A) of FIG. 4A, with symmetrically arranged body diodes D (702), D' (702'), and symmetrically arranged resistors R (802), R' (802') used for biasing the symmetric FET when used in a stack operating as an RF switch. As in the case of the symmetric FET (400A) described above, symmetry in structures and voltages provided by the layout depicted in FIG. 8 can promote reduction in asymmetry of capacitances inherent to the circuit (800) and therefore reduce related harmonic contributions of the circuit, specifically when the FET operates in the OFF state. As shown in FIG. 8, connecting structures (850) in combination with contact structures (855) are used to electrically interconnect structures related to the symmetric FET (408), the diodes (702, 702') and the resistors (802, 802') according to the schematic diagram shown in FIG. 9.

Figure 10:
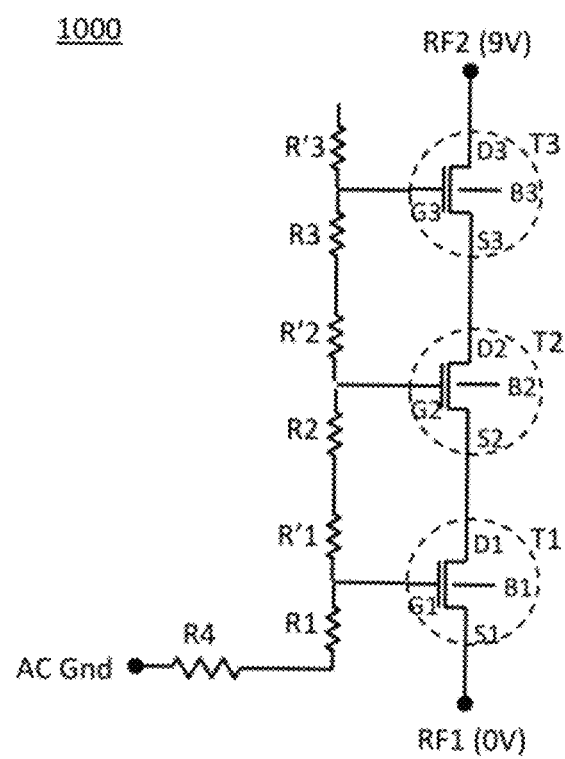
FIG. 10 is a schematic diagram of a symmetric RF switch according to the present disclosure that uses a stack of symmetric FETs having layouts as shown in FIG. 4A and FIG. 8.

FIG. 10 is a schematic diagram of a symmetric RF switch (1000) according to an embodiment of the present disclosure that uses a stack of symmetric FETs (T1, T2, T3), each FET having a structural geometry as provided by the layout shown in FIG. 4A and described above. Further symmetry to a layout of the symmetric RF switch (1000) can be provided by using a layout similar to one depicted in FIG. 8 and described above. Although one or both of the diodes (702, 702') may be optional, symmetrical arrangement of the biasing resistors (R2, R'2) as depicted in FIG. 8 can further enhance performance of the symmetric RF switch (1000) with respect to second order harmonic distortion. As described in the above referenced U.S. patent application Ser. No. 15/289,768, the disclosure of which is incorporated herein by reference in its entirety, biasing using a symmetrical resistive ladder (R1, R'1, R2, R'2, R3, R'3) as shown in FIG. 10 can be used to reduce power dissipation in the resistors of the ladder. As can be seen in FIG. 10, the resistor R'3 may be a floating resistor which is left open on one end of the resistor and kept for the sake of symmetry. Alternatively, the resistor R'3 may be used for connection to other circuits and/or voltage/current sources for biasing of the symmetrical resistive ladder.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A circuit, comprising:
   a stack of a plurality of symmetric field effect transistors (FETs) arranged in a sequence from a first symmetric FET to a last symmetric FET, each of the plurality of symmetric FETs comprising:
      two half FETs comprising a first half FET and a second half FET, the two half FETs connected in parallel with each other;
      first and second gate structures each having respective N gate fingers defining respective N channels, N sources and N drains of each of the two half FETs;
      a first source of the N sources of the first half FET formed at an outer edge of the first half FET opposite and immediately exterior of a first gate finger of the respective N gate fingers, and a first drain of the N drain fingers of the first half FET formed opposite and immediately interior of the first gate finger of the first half FET,
      a first drain of the N drains of the second half FET formed at an outer edge of the first second FET opposite and immediately exterior of a first gate finger of the respective N gate fingers, and a first source of the N sources of the second half FET formed opposite and immediately interior of the first gate finger of the second half FET,
   wherein:
      the N sources of each of the first and second half FETs are connected, and the N drains of each of the first and second half FETs are connected,
      the N sources of the first half FET and the N sources of the second half FET are connected together by two layers, and the N drains of the first half FET and the N drains of the second half FET are connected together by the two layers,
      a source of a second symmetric FET of the stack is connected to a drain of the first symmetric FET of the stack, and
      a source of each remaining symmetric FET of the stack is connected to a drain of a symmetric FET of the stack that is arranged immediately below according to the sequence.

2. The circuit of claim 1, wherein at least one of the plurality of symmetric FETs comprises a body contact region arranged between the first and second gate structures and extending across a full width of the symmetric FET.

3. The circuit of claim 1, wherein each pair of source and drain of the N sources and drains of the first half FET is connected to a respective pair of source and drain of the N sources and drains of the second half FET via a respective crossing structure formed on at least two layers of the symmetric FET.

4. The circuit of claim 1, wherein at least one of the at least two layers comprises a sequence of alternating source crossing structures and drain crossing structures.

5. The circuit of claim 1, wherein each of the two layers comprises a metal layer.

6. The circuit of claim 1, wherein each of the at least two layers comprises only one of: a) source crossing structures, and b) drain crossing structures.

7. The circuit of claim 1, further comprising a body contact region arranged between the first and second gate structures and extending across a full width of the symmetric FET.

8. The circuit of claim 7, further comprising a first diode and a second diode symmetrically arranged along a respective edge of the first and second gate structures away from the body contact region, the first and second diodes respectively configured to provide a conduction path between the body contact region and the first and second gate structures.

9. The circuit of claim 7, further comprising a diode arranged along an edge of one of the first gate structure and the second gate structure, away from the body contact region, the diode configured to provide a conduction path between the body contact region and the one of the first gate structure and the second gate structure.

10. A radio frequency (RF) switch comprising the circuit of claim 1, wherein symmetry in structures provided by a layout of the first and second half FETs of the symmetric FET provides symmetry in RF voltages coupled to the structures in an OFF state of the RF switch.

11. The radio frequency (RF) switch of claim 10, wherein the at least one symmetric FET comprises a plurality of symmetric FETs arranged according to a stack configuration.

12. The radio frequency (RF) switch of claim 11, wherein the RF switch further comprises a biasing circuit comprising a resistive ladder with nodes that are coupled to gates nodes of the plurality of symmetric FETs.

13. The radio frequency (RF) switch of claim 12, wherein resistors of the resistive ladder are arranged symmetrically with respect to a structural geometry of the plurality of symmetric FETs.

14. The radio frequency (RF) switch of claim 11, wherein the plurality of symmetric FETs comprises a number of symmetric FETs that is equal to or larger than three.

15. The radio frequency (RF) switch of claim 11, wherein the RF switch is monolithically integrated using a fabrication technology comprising one of: a) silicon-on-insulator (SOI) technology, and b) silicon-on-sapphire technology (SOS).

16. An electronic module comprising the circuit of claim 1.

17. A method, comprising:
   using of the electronic module of claim 16 in one or more electronic systems comprising: a) a television, b) a cellular telephone, c) a personal computer, d) a workstation, e) a radio, f) a video player, g) an audio player, h) a vehicle, i) a medical device, and j) other electronic systems.

18. The circuit of claim 1, wherein at least one of the at least two layers comprises source crossing structures and/or drain crossing structures.

19. The symmetric field effect transistor (FET) of claim 1, wherein the symmetric FET is fabricated using one of: a) silicon-on-insulator (SOI) technology, and b) silicon-on-sapphire technology (SOS).

20. A method for reducing OFF state parasitic capacitance of a field effect transistor (FET) operating as a radio frequency (RF) switch, the method comprising:
   arranging a gate structure in a medial region of a planar layout of the FET;

arranging a source structure and a drain structure in respective opposite edges of the planar layout;

projecting gate fingers outwardly from the gate structure towards the opposite edges;

projecting interdigitated source and drain structures inwardly from respective source and drain structures towards respective opposite edges and along the gate fingers;

crossing pairs of the interdigitated source and drain structures in the medial region where the gate structure is arranged;

based on the crossing, reversing a sequence of the interdigitated source and drain structures along the gate fingers, thereby providing a symmetry in RF voltages coupled to structures of the FET in the OFF state; and based on the symmetry in the RF voltages, reducing parasitic capacitance wherein a total number of gate fingers that project outwardly towards one of the respective opposite edges is equal to a total number of gate fingers that project outwardly towards the other of the respective opposite edges.

21. The method according to claim 20, further comprising:

arranging a body contact region in the medial region and centered with respect to the gate structure, the body contact region extending a full width of the FET.

22. A symmetric field effect transistor (FET) comprising:

a gate structure arranged in a medial region of a planar layout of the symmetric FET;

a source structure and a drain structure arranged in respective opposite edges of the planar layout;

gate fingers that project outwardly from the gate structure towards the opposite edges; and interdigitated source and drain structures that project inwardly from respective source and drain structures towards respective opposite edges and along the gate fingers; and source and drain crossing structures arranged in the medial region where the gate structure is arranged, configured to provide crossings of pairs of the interdigitated source and drain structures so to reverse a sequence of the interdigitated source and drain structures along the gate fingers in a top half of the layout with respect to a bottom half of the layout wherein a total number of gate fingers that project outwardly towards one of the respective opposite edges is equal to a total number of gate fingers that project outwardly towards the other of the respective opposite edges.

23. The symmetric field effect transistor (FET) of claim 22, further comprising:

a body contact region arranged in the medial region and centered with respect to the gate structure, the body contact region extending a full width of the FET.

* * * * *